United States Patent
Eichenfield (10) Patent No.: US 10,491,190 B1
(45) Date of Patent: Nov. 26, 2019

(54) EVANESCENTLY COUPLED PIEZOELECTRIC ACOUSTIC DEVICES

(71) Applicant: National Technology & Engineering Solutions of Sandia, LLC, Albuquerque, NM (US)

(72) Inventor: Matt Eichenfield, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 324 days.

(21) Appl. No.: 15/718,796

(22) Filed: Sep. 28, 2017

Related U.S. Application Data (60) Provisional application No. 62/404,406, filed on Oct. 5, 2016.

(51) Int. Cl.
*H03H 9/17* (2006.01)
*G01H 3/06* (2006.01)
*H03H 9/205* (2006.01)

(52) U.S. Cl.
CPC .............. *H03H 9/176* (2013.01); *G01H 3/06* (2013.01); *H03H 9/205* (2013.01)

(58) Field of Classification Search
CPC ............................... H03H 9/176; H03H 9/205
USPC ......................................................... 310/322
See application file for complete search history.

(56) References Cited

U.S. PATENT DOCUMENTS

2013/0320804 A1* 12/2013 Symko .................... F02G 1/043
310/306

OTHER PUBLICATIONS

Bond, W. L. et al., "Acoustic Surface Wave Coupling Across an Air Gap", Appl. Phys. Lett., 1969, 1652741, vol. 14.
Coldren, L. A. et al., "Monolithic Acoustic Surface-Wave Amplifier", Applied Physics Letters, 1971, pp. 317-319, vol. 18.
Coldren, L. A. et al., "CW Monolithic Acoustic Surface Wave Amplifier Incorporated in a v/v waveguide", Applied Physics Letters, 1973, pp. 117-118, vol. 23.
Eichenfield, M. et al., "Design, fabrication, and measurement of RF IDTs for efficient coupling to wavelength-scale structures in thin piezoelectric films", Joint UFFC, EFTF and PFM Symposium, 2013.
Eichenfield. M. "Acoustoelectric Devices: Then and Now", 2015, Sandia National Laboratories, SAND2015-8536PE.
Kino, G. S. et al., "Noise figure calculation for the Rayleigh wave amplifier", 1973, Applied Physics Letters, pp. 50-52, vol. 22.
Kino, G. S. et al., "A Normal Mode Theory for the Rayleigh Wave Amplifier", 1971, IEEE Transactions on Electron Devices, pp. 909-920, vol. ED-18.

(Continued)

*Primary Examiner* — Derek J Rosenau
(74) *Attorney, Agent, or Firm* — Martin I. Finston (57) ABSTRACT

An electro-acoustic device includes a plurality of suspended, piezoelectric, acoustically waveguiding membranes supported in a common plane. An input transducer coupled to one of the waveguiding membranes converts input electrical signals to traveling-wave acoustic signals. An output transducer coupled to one of the waveguiding membranes converts acoustic signals to electrical signals. At least two of the waveguiding membrane have parallel straight sections that are longer than a guided acoustic wavelength and that are mutually separated by an air gap having a width less than the guided acoustic wavelength.

14 Claims, 5 Drawing Sheets

(56) References Cited

OTHER PUBLICATIONS

Lakin, K M. et al., "Surface Wave Delay Line Amplifiers", IEEE Transactions on Microwave Theory and Techniques, 1969, pp. 912-920, vol. MTT-17.

Liang, K. et al., "Precision measurement of Rayleigh wave velocity perturbation", Applied Physics Letters, 1982, pp. 1124-1126, vol. 41.

Dlsson, R. H. et al., "A high electromechanical coupling coefficient SH0 Lamb wave lithium niobate micromechanical resonator and a method for fabrication", Sensors and Actuators A, 2014, pp. 183-190, vol. 209.

White, R. M. "Surface Elastic-Wave Propagation and Amplification", IEEE Transactions on Electron Devices, 1967, pp. 181-189, vol. ED-14.

Yamanouchi, K. et al., "Propagation and Amplification of Rayleigh Waves and Piezoelectric Leaky Surface Waves in LiNbO3", Journal of Applied Physics, 1972, pp. 856-862, vol. 43.

* cited by examiner

EVANESCENTLY COUPLED PIEZOELECTRIC ACOUSTIC DEVICES

CROSS-REFERENCE TO RELATED APPLICATION

This application claims the benefit of U.S. Provisional Application No. 62/404,406, filed Oct. 5, 2016, the entirety of which is hereby incorporated herein by reference.

ACKNOWLEDGEMENT OF GOVERNMENT SUPPORT

This invention was made with Government support under Contract No. DE-AC04-94AL85000 between Sandia Corporation and the U.S. Department of Energy. The Government has certain rights in the invention.

FIELD OF THE INVENTION

The invention relates to devices for radio-frequency signal processing that use piezoelectric materials.

ART BACKGROUND

It is known that when acoustic waves propagate in piezoelectric media, they co-propagate with electromagnetic energy. The electric fields travel at the velocity of the acoustic wave rather than at the speed of light. These fields decay evanescently into the surrounding air or vacuum that bounds the piezoelectric medium. Because the electromagnetic wave travels at the acoustic velocity, the wavelength associated with the evanescent decay is the acoustic wavelength and not the radio-frequency electromagnetic wavelength, which may be longer by four or more orders of magnitude.

It has also long been known that the evanescent electromagnetic fields can be used to couple surface acoustic waves (SAWs) across an air gap between propagation media. This principle was demonstrated in 1969, as reported in W. L. Bond et al., "Acoustic Surface Wave Coupling Across an Air Gap," *Appl. Phys. Lett.* 14, 122 (1969) (hereinafter, "Bond et al."). Bond et al. reported evanescent coupling across an air gap between two lithium niobate SAW delay lines.

Evanescent coupling between guided acoustic waves can potentially be exploited for radio-frequency signal processing. For example, it could allow for frequency-dependent or frequency-selective processing by resonant structures that are of tractable dimensions because they are scaled to the acoustic wavelength instead of the electromagnetic wavelength.

However, the results reported by Bond et al. failed to achieve widespread practical application due in part to the difficulty of setting a precise air gap between two very thick lithium niobate substrates for very long distances. Although coupling of signals between two separate chips was achievable, there was no simple path to the successful integration of two coupled acoustic waveguides on the same chip, as would be necessary in a practical device for radio-frequency signal processing.

SUMMARY OF THE INVENTION

We have made the discovery that with the help of recent advances in microfabrication techniques, it is possible to fabricate a new class of devices in which two or more thin-film piezoelectric acoustic structures are evanescently coupled on the same chip and in the same plane. Lithium niobate is one possible composition, but not the only one, for the piezoelectric thin films.

Accordingly, an embodiment of the invention in a broad aspect is an electro-acoustic device having a range of operating frequencies including a frequency f corresponding to a guided acoustic wavelength $\lambda$. The device includes input and output transducers that respectively convert input electrical signals to acoustic signals and convert acoustic signals to electrical signals.

The device includes a substrate and a plurality of suspended, piezoelectric, acoustically waveguiding membranes that are supported in a common plane by the substrate. The input transducer is coupled to one of the waveguiding membranes and launches a traveling acoustic wave into the coupled membrane. The output transducer is coupled to one of the waveguiding membranes. In at least some embodiments, the acoustically waveguiding membranes are less than $\lambda$ in thickness.

The plurality of waveguiding membranes includes at least a first and a second waveguiding membrane having equally long straight sections that are parallel to each other, longer than the wavelength $\lambda$, and mutually separated by an air gap having a width less than the wavelength $\lambda$.

In embodiments, the acoustically waveguiding membranes are less than $\lambda$ in width.

In embodiments, the acoustically waveguiding membranes are composed of lithium niobate. In more specific embodiments, the lithium niobate is Z-cut.

In embodiments, the height and the width of the acoustically waveguiding membranes are selected such that a quasi-shear-horizontal (quasi-SH) mode is guided at the frequency f. In more specific embodiments, the guided quasi-SH mode is a fundamental mode.

In embodiments, the input transducer is coupled so as to inject acoustic waves into the first waveguiding membrane, and the output transducer is coupled so as to receive acoustic waves from the second waveguiding membrane. In other embodiments, the input and output transducers are coupled to respective ends of the first waveguiding membrane, and the second waveguiding membrane is conformed in a closed curve as a ring resonator.

In other embodiments, the first waveguiding membrane is conformed in a closed curve as a ring resonator having two equally long and parallel straight sections positioned on opposing sides of the closed curve. The plurality of waveguiding membranes includes a third waveguiding membrane having a straight section equal in length and parallel to the straight sections of the first and second waveguiding membranes. The second and third waveguiding membranes are respectively positioned on opposite sides of the ring resonator such that each of their respective straight sections is separated from a respective straight resonator section by an air gap. Each of the air gaps has a width less than the wavelength $\lambda$. At least one input transducer is coupled to the second waveguiding membrane, and at least one output transducer is coupled to the third waveguiding membrane.

In embodiments, the electro-acoustic device is conformed as a displacement sensor or as an inertial sensor in which the substrate comprises a reference platform and a variable platform that is displaceable relative to the reference platform. The first waveguiding membrane is attached to the reference platform, and the second waveguiding membrane is attached to the variable platform such that relative displacement of the variable platform varies the width of the air gap. In embodiments for inertial sensing, an inertial proof mass is attached to the variable platform.

In embodiments, each input and output transducer has an electrical impedance of 50Ω when operated within the range of operating frequencies.

In embodiments, the equally long straight sections of the waveguides that are parallel to each other and separated by air gaps have a length in the range 0.1 to 10 millimeters.

DETAILED DESCRIPTION

In example embodiments, a pair of parallel acoustic waveguides that have been dimensioned to support the same acoustic modes are evanescently coupled across a gap. We refer to the gap as an "air gap," although the gap may be a vacuum gap or a gap filled with air of any of various other compressed or rarefied gases or gases at standard pressure. Provided the parallel waveguides (which may be portions of waveguides of more complex shape) are long enough, the evanescent coupling leads to a partial, or even to a total, transfer of energy from a traveling wave in one of the waveguides to a traveling wave in the other waveguide.

Given a mode m supported by each of the waveguides in isolation, cross-coupling between the two waveguides will split the mode into a symmetrically coupled mode $m_{sc}$ and an asymmetrically coupled mode $m_{ac}$ of the two-waveguide system. (The terms "asymmetric" and "antisymmetric" are used interchangeably hereinafter.) The respective propagation velocities of the coupled modes will be shifted in opposite directions from the velocity v in the isolated waveguide, and they will be separated by a velocity shift δv.

According to an estimate derived from coupled mode theory, the conversion length, i.e. the length required for a complete transfer of energy of the propagating mode from one waveguide to the other, is $(v/\delta v) \cdot \lambda$, where λ is the wavelength of the propagating mode. The velocity shift δv increases with the electromechanical coupling coefficient of the piezoelectric waveguide material, and it decreases with the size of the air gap relative to λ. Factors affecting the applicable electromechanical coupling coefficient or otherwise affecting the velocity shift include the cut (i.e., the crystallographic orientation with which the piezoelectric crystal has been sectioned), the polarization of the acoustic wave, and the waveguide geometry.

For a given wavelength and velocity, it is desirable to design for a velocity shift that yields a conversion length that falls within the geometrical constraints of the desired device. Assuming, for example, a wavelength of 5 μm, it would be necessary to have δv/v greater than about 0.5% in order to have a conversion length less than 1 mm.

One piezoelectric material that is very useful in this regard is lithium niobate, not only because it provides very high electromechanical coupling coefficients, but also because micromachining techniques are available that can form it into coupled, coplanar, thin-film structures. Depending on the cut (i.e., the crystallographic orientation with which the piezoelectric crystal has been sectioned), the acoustic mode, and the acoustic polarization, electromechanical coupling coefficients (expressed as $\kappa^2$) greater than 10% have been achieved, and quality factors greater than 1000 have been achieved for some lithium niobate resonators.

In an example, we modeled a waveguide consisting of a bar of lithium niobate (LN) vibrating in the fundamental quasi-shear-horizontal (quasi-SH0) mode. The bar was of Z-cut LN, i.e., the Z axis (also referred to as the c-axis) was parallel to the z-coordinate axis, i.e. the axis perpendicular to both the propagation direction (i.e., the x-direction) and the horizontal direction of shear displacement (i.e., the y-direction). The bar was one wavelength λ in length, 0.1λ in thickness (i.e., in the z-direction), and 0.3λ in width (i.e., in the y-direction). The quasi-SH0 mode has a velocity v of 2466.3 m/s for this aspect ratio, independent of frequency.

Our modeling studies showed that the electric potential (hence also the electric field) extends to a significant distance outside the bar, with a decay length of about one acoustic wavelength. We found a peak voltage of 1.8V per nanometer of peak acoustic displacement, relative to ground potential at infinite distance.

In our model, we introduced an identical second waveguide coplanar and parallel to the first, and separated from it by an air gap of width λ/20. We found that the velocity $v_{sc}$ of the symmetrically coupled mode was increased to 2467.9 m/s, and that the velocity $v_{ac}$ of the asymmetrically coupled mode was reduced to 2460.2 m/s, giving a total fractional velocity shift δv/v of 0.3%.

At a driving frequency of 500 MHz, the waveguides described above have a wavelength λ of 5 μm. At a fractional velocity shift of 0.3%, complete power transfer between the waveguides occurs over a conversion length of about 300λ, or about 1.5 mm. Hence a 6 dB coupler could be made with a length of about 75λ, or about 0.375 mm. Even more favorable results might be obtainable by optimizing over all possible cuts, propagation directions, and geometries.

Figure 1:
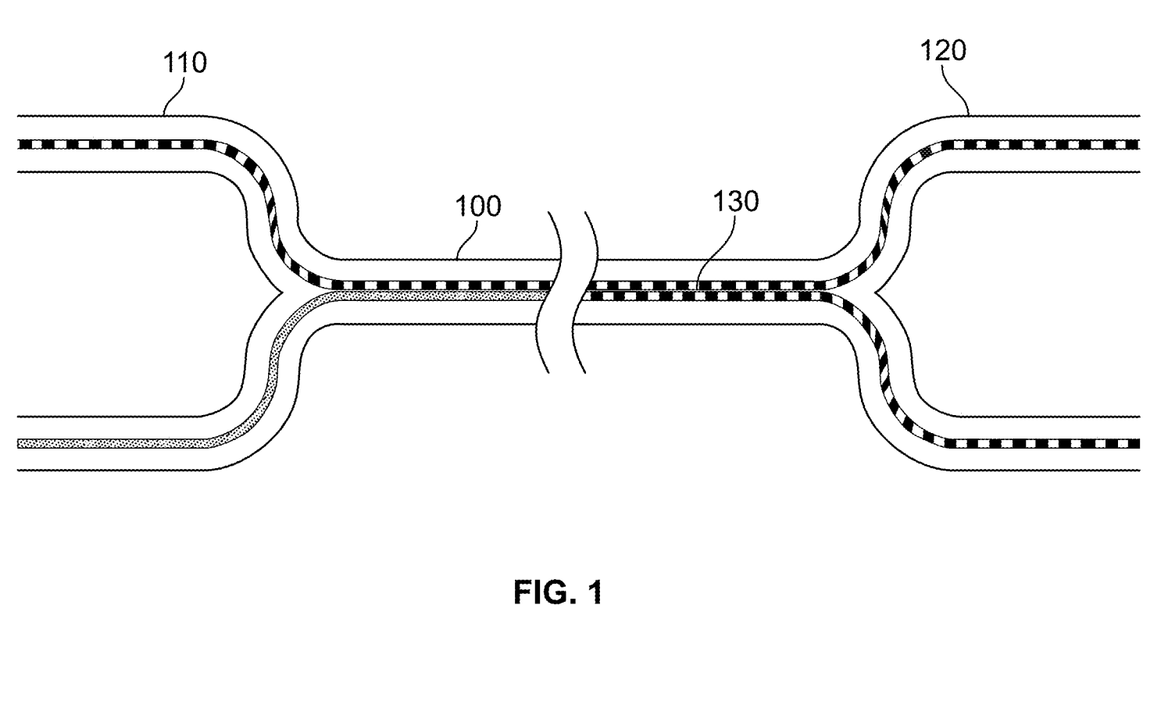
FIG. 1 is a plan view of a 6 dB directional coupler according to an embodiment described herein.

FIG. 1 is a plan view of a 6 dB directional coupler 100 that we modeled using a finite element simulation that used perfectly matched layer (PML) conditions at the boundaries and included a voltage source. The LN waveguides were Z-cut. In the simulation, the wavevectors of the propagating waves are in the x-direction (relative both to the crystallographic coordinates and to our geometric coordinate system). A quasi-SH mode with a wavelength of 10 μm is launched into the input waveguide 110, which is 3 μm wide and 0.1 μm thick. The input waveguide meets an output waveguide 120. The two waveguides run parallel with an air gap 130 of 0.5 μm for a length of 81 wavelengths. As a consequence, 6 dB of the power initially in the input waveguide is transferred into the output waveguide over the 81λ coupled length. Longer or shorter lengths would result in the coupling of greater or lesser power fractions. The value 81λ obtained from the simulation is remarkably close to the estimated value of 75λ obtained from simple coupled mode theory.

The device of FIG. 1 offers the advantage of very small size. The device could be made even more compact by fashioning a serpentine interaction region.

Figure 2:
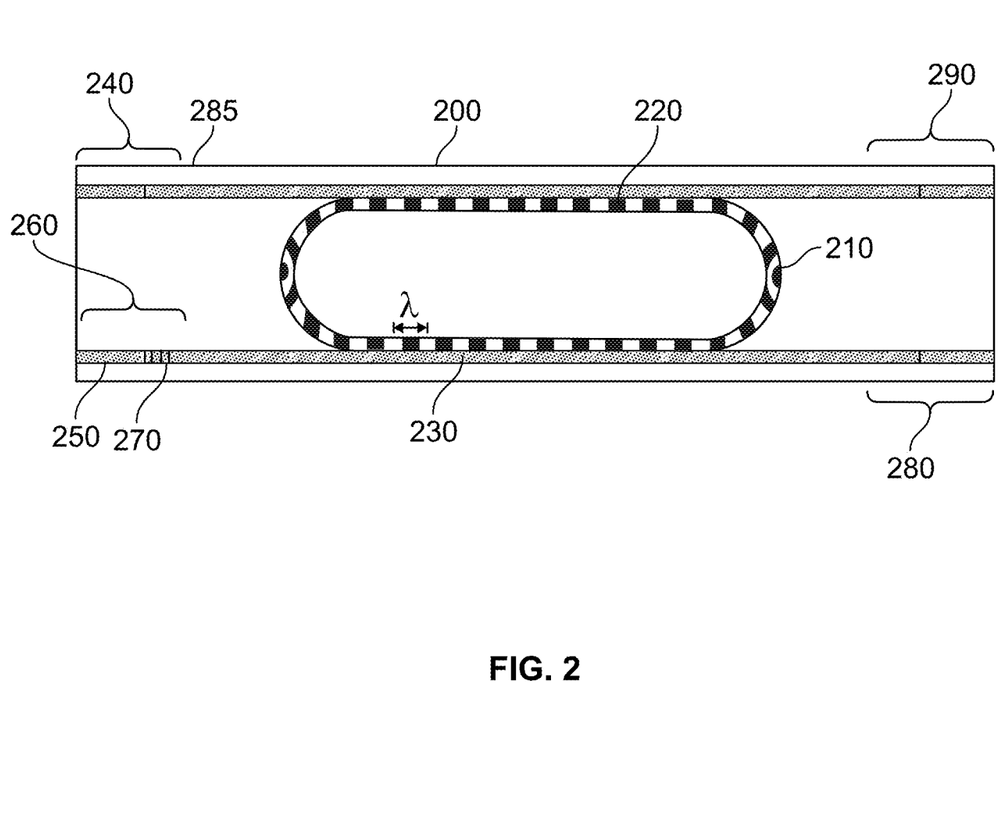
FIG. 2 is a plan view of a waveguide-coupled resonator according to a further embodiment described herein.

FIG. 2 is a plan view of a waveguide-coupled resonator 200 according to another example embodiment. The device of FIG. 2 can be used, e.g., as an add-drop filter.

As seen in the figure, the device includes a racetrack resonator 210. The racetrack resonator is conformed as a closed curve including two symmetrically placed, parallel, straight sides shown in the figure as top side 220 and bottom side 230. The terms "top" and "bottom" are intended purely for convenience and are not meant to be limiting.

Two straight waveguides are also shown in the figure, i.e. waveguide 240 adjacent the top side of the resonator and bottom waveguide 250 adjacent the bottom side of the resonator. The two straight waveguides and the resonator all have the same cross-sectional dimensions. Each of the straight waveguides is separated from the adjacent section of the resonator by an air gap.

We performed finite element simulations of the system of FIG. 2, assuming the same dimensions as in the preceding example. The air gap had a width of $\lambda/20$, or 0.5 μm for a wavelength of 10 μm.

As is well known in the field of waveguide-coupled optical resonators, the parameter K, defined as the ratio of the waveguide-cavity coupling rate to the intrinsic cavity loss rate, is critical to the performance of the system. If K is too great, the system will be overcoupled. This results in damped cavity behavior, with a relatively low Q factor and a resonance that may be too broad. Conversely, if K is too small, the system will be undercoupled, and desired filtering or switching behavior may be unacceptably weak.

Encouragingly, our finite element simulations predict that the favorable value K=1 can readily be achieved for realistic intrinsic cavity loss rates.

The system of FIG. 2 is useful as, e.g., an acoustic add-drop filter. Because the resonator can be made completely free of metal, such an arrangement can potentially exhibit a smaller intrinsic loss rate than resonant add-drop filters of the prior art.

Figure 3:
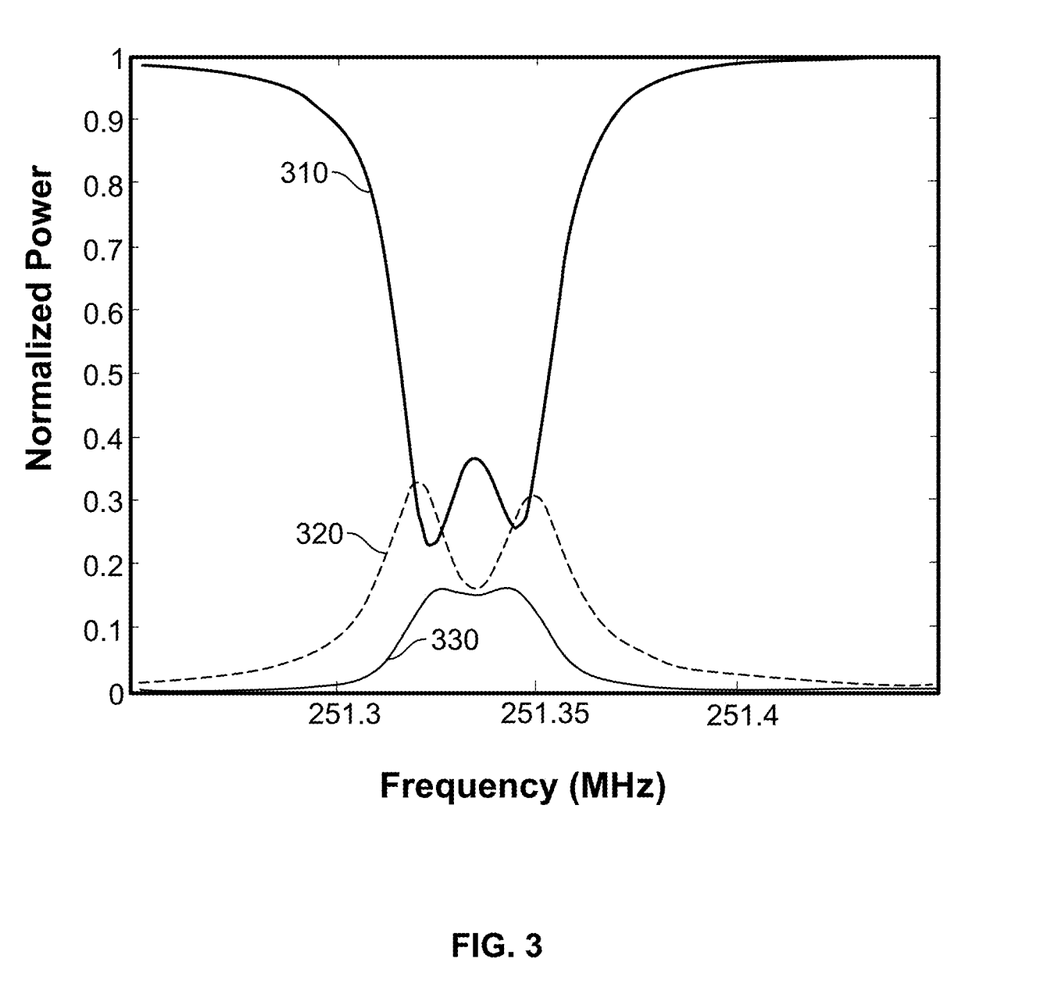
FIG. 3 is a set of response curves for a waveguide-coupled resonator of the kind illustrated in FIG. 2 and configured as an add-drop filter.

FIG. 3 is a set of response curves for an add-drop filter of the kind illustrated in FIG. 2. The curves were generated from our finite element simulations. With reference to FIG. 2, port 260 on the bottom waveguide is specified to be the input port. At the input port, a set 270 of radio-frequency driving electrodes causes the acoustic wave to be injected into the bottom waveguide. The three curves plotted in FIG. 3 respectively represent the responses (as power, in arbitrary units) at through port 280 (uppermost curve 310), drop port 285 (middle curve 320), and add port 290 (bottom curve 330) as a function of frequency. The resonance is clearly visible at about 251.33 MHz.

In further example embodiments, a coupled resonator includes two identical (or nearly identical) resonant structures that are evanescently coupled to each other. The evanescent coupling leads to symmetric and antisymmetric resonator modes having different acoustic propagation velocities and different resonant frequencies. The frequency tuning depends exponentially on the width of the air gap between the resonators.

To describe the behavior of our coupled acoustic resonators, we define an electromechanical coupling rate g by $g/2\pi = \partial f/\partial x$, where f is the resonant frequency and x is the width of the air gap. To provide a figure of merit applicable to displacement sensing and the like, we further define a relative electromechanical coupling rate $\tilde{g}$ in which the positional tuning is normalized to the linewidth $\delta f$. That is, $\tilde{g} = g/2\pi\delta f = (Q/f) = \partial f/\partial x$, where Q is the quality factor of the resonator.

Figure 4:
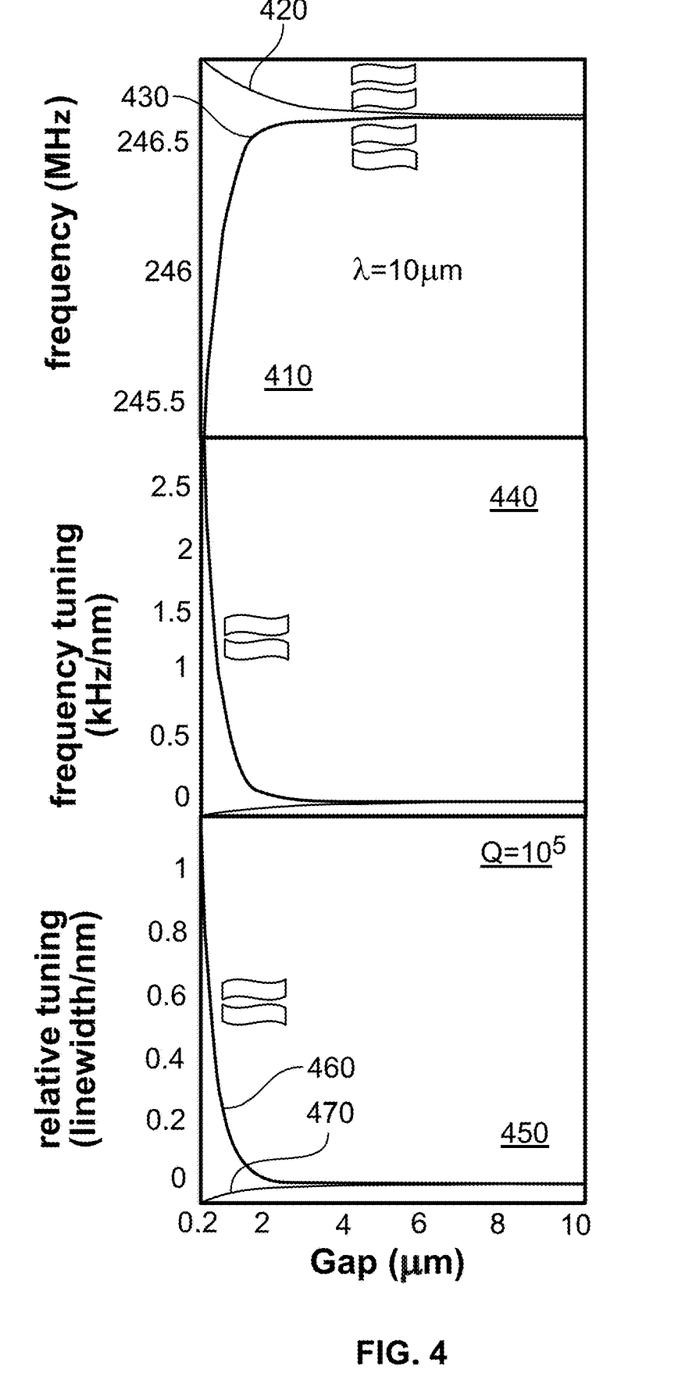
FIG. 4 provides three plots describing the positional tuning of a coupled acoustic resonator according to further embodiments described herein.

FIG. 4 provides three plots describing the positional tuning of a coupled acoustic resonator. The plots were generated by numerical modeling. The horizontal access for all three plots represents the width of the air gap, which ranges from $0.02\lambda$ to $1.0\lambda$, with a wavelength $\lambda$ of 10 μm. The uppermost plot 410 shows the variation in the resonant frequency. The upper curve 420 represents the symmetric mode, and the lower curve 430 represents the antisymmetric mode. The middle plot 440 shows the frequency tuning, i.e. the shift in resonant frequency, relative to the isolated single resonator, for the antisymmetric mode (upper curve) and the symmetric mode (lower curve). The bottom plot 450 shows the relative tuning, in units of linewidth per nanometer, for the antisymmetric mode (upper curve 460) and the symmetric mode (lower curve 470). The relative tuning is calculated assuming a Q factor of $10^5$.

Optomechanical inertial sensors, in which displacement is detected between coupled optical resonators, are known in the prior art. In operation, the resonator frequency is measured and the frequency shift is determined. This provides a measure of the separation between the two individual resonators.

These prior-art sensors typically depend on a relative coupling rate of about 0.1/nm. As will be evident from the bottom plot in FIG. 4, if a Q factor of $10^5$ can be achieved, a competitive relative coupling rate can be achieved at least for air gap widths between 0.2 μm and 1.5 μm. We believe that widths as small as 0.2 μm, or even smaller, can be fabricated using techniques to be described below. Q factors as high as about 5000 have been achieved in lithium niobate resonators that are line-broadened by the presence of metal. By eliminating all metal from the resonator, a twenty-fold improvement to $Q=10^5$ may be possible. Even without such an improvement, we believe that sensor made according to the principles described here will have a useful operating range for at least some applications.

Figure 5:
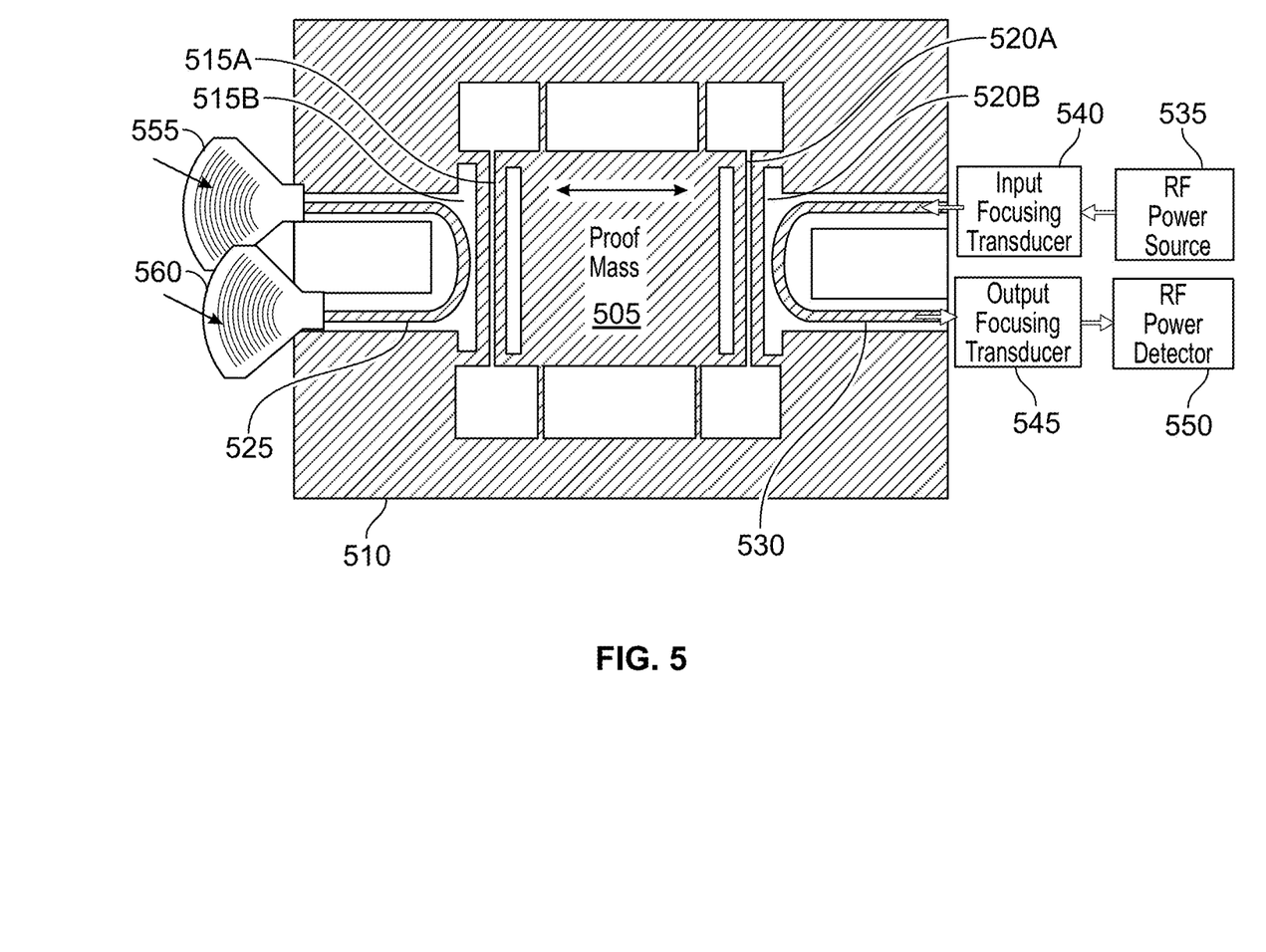
FIG. 5 is a simplified plan view of an inertial sensor that uses pairs of resonators to sense displacement of a proof mass.

FIG. 5 is a simplified plan view of an inertial sensor that uses pairs of resonators to sense displacement of a proof mass. As seen in the figure, a proof mass 505 is mounted on a moveable portion of the substrate 510. The moveable portion may, e.g., be suspended from a fixed portion of the substrate (which may be configured as a frame) using a micromachined spring arrangement or other suspension made using well-known techniques of MEMS technology.

As illustrated, the moveable portion is configured to be translatable. However, other arrangements are readily envisaged, in which the moveable portion is configured to be rotatable, so that rotational acceleration rather than linear acceleration can be detected.

Also shown in the figure are coupled resonator pair 515A, 515B and coupled resonator pair 520A, 520B. Within each pair, one of the resonators (515A, 520A) is in a fixed position relative to the proof mass, and the other resonator (515B, 520B) is in a fixed position relative to the fixed portion of the substrate.

In operation, inertial forces cause the air gaps between the resonators in each pair to change, in consequence of which there is a corresponding shift in the resonant frequencies of the resonators. The frequency shifts are read out, e.g. as a direct frequency reading or as a measurement of the power reflection or power transmission of the system.

With further reference to the figure, it will be seen that the fixed half of each resonator pair is evanescently coupled to a feeder waveguide 525, 530, which is used both to drive the resonator pair and to interrogate it. Depicted notionally on the right-hand side of the figure as coupled to feeder waveguide 530 is a driver chain consisting of radio-frequency power source 535 and input transducer 540. Also depicted notionally on the same side of the figure as coupled to feeder waveguide 530 is a detection chain consisting of output transducer 545 and radio-frequency detector 550.

The arrangement depicted in FIG. 5 includes a similar driver chain and a similar detection chain coupled to feeder waveguide 525, on the left-hand side of the figure. For convenience, however, the power sources have been omitted from the left-hand side of the figure, and the input and output transducers have been represented symbolically as focusing electro-acoustic transducers 555, 560.

Although not critical, it is advantageous to use transducers that have focusing properties because they have the potential to offer high efficiency. A focusing electroacoustic transducer is described in M. Eichenfield and R. H. Olsson III, "Design, fabrication, and measurement of RF IDTs for efficient coupling to wavelength-scale structures in thin piezoelectric films," 2013 Joint UFFC, EFTF and PFM Symposium, IEEE (2013) 753-756, the entirety of which is hereby incorporated herein by reference.

Briefly, Eichenfield and Olsson reported on the design and demonstration of a transducer that produced a Gaussian acoustic beam in a 750 nm thick suspended aluminum nitride membrane. In operation, a substantially uniform electric field applied between top and bottom electrodes produced a substantially uniform volumetric piezoelectric force to the suspended piezoelectric membrane. This force excited Lamb-type waves in the membrane. In the far field, the Lamb waves approximated a Gaussian beam. This was facilitated by a fan-like array of curved finger electrodes. The direction of the advancing wavefront was determined by the local normal to the curved edge of the finger.

In the fabrication process that Eichenfield and Olsson reported, a high resistivity six-inch silicon wafer was overcoated by deposition of a 0.6 µm oxide layer followed by a 4 µm polysilicon release layer. The polysilicon was patterned to define the locations of release trenches where the AlN membranes would be undercut and suspended. An oxide layer was deposited and chemically-mechanically polished to expose the patterned polysilicon release layer. Tungsten plugs were machined into the oxide for contact to the bottom electrode. The electrically grounded bottom electrode, formed from 20/20/50 nm of Ti/TiN/Al, was then deposited and patterned. A 0.75 µm layer of AlN was sputter deposited. Vias were etched in the AlN, landing on the tungsten plugs. A top electrode layer of 70/20 nm of Al/TiN was deposited and patterned to form the piezoelectric transducers. The release trenches were then etched to expose the polysilicon release layer and to concurrently create back reflectors and waveguides. The device was suspended from the substrate using a dry release etch in xenon difluoride.

Although the fabrication process described above is directed to devices formed on suspended membranes of aluminum nitride, those skilled in the art will recognize that with suitable modifications, a similar process can be applied to suspended membranes of lithium niobate, among other materials, and as such can readily be integrated with the LN fabrication process to be described below.

A process for fabricating acoustic waveguiding devices in suspended LN membranes is described in Roy H. Olsson III, et al., "A high electromechanical coupling coefficient SH0 Lamb wave lithium niobate micromechanical resonator and a method for fabrication," *Sensors and Actuators A* 209 (2014) 183-190, the entirety of which is hereby incorporated herein by reference.

In the process reported by Olsson et al., thin plates of LN are fabricated using ion implantation of helium to create an ion damaged layer of LN at a desired depth below the wafer surface. This damaged layer is selectively wet etched in a hydrofluoric (HF) acid based chemistry to form thin, suspended plates of LN.

The first step in the process is evaporation of 100 nm of chromium (Cr) and patterning of alignment marks in the Cr on X-cut LN. An oxide layer is then deposited and patterned to define areas where an ion implant will subsequently penetrate the LN, thereby creating an ion-damaged LN release layer at the end of the ion implant range. This patterning affords precise control over the lateral extents of the device release.

The sample is then implanted with helium at a dose of $1 \times 10^{16}$ atoms/cm$^3$ at an energy of 0.8 MeV. This creates an ion damaged release layer in the LN approximately 1.8 µm below the wafer surface. The implants can be performed using an electrostatic ion beam accelerator. In the work reported by Olsson et al., a 3-MV Pelletron available from National Electrostatics Corporation (NEC) is used, operating at a current of less than 7 µA. To maintain a low sample temperature, the LN is cooled by liquid nitrogen, using a copper braid, during the implantation. Olsson et al. reported that measurements conducted while the ion implant was passing through the chromium electrodes in the device region confirmed that the resistivity of the chromium was not altered by the ion implant.

Next, trenches are etched in the LN to expose the ion-damaged release layer. These trenches define the final dimensions of the LN resonators, concomitantly defining the resonant frequencies. The trenches are cut in a dry etch at 15° C. using an Ar/BCl$_3$/Cl$_2$ gas mixture at a pressure of 10 mT. For this step, Olsson et al. reported using a Versaline® four-inch ICP system from Plasma-Therm. With suitable optimization, the dry etch process could reportedly produce sidewalls with sidewall angles greater than 80° and etch depths greater than 2 µm.

The chromium electrodes are patterned. The devices are then released using a wet hydrofluoric acid chemistry to remove the ion-damaged LN. The devices are then annealed at a temperature above 300° C. to heal the implant damage in the device layer and to flatten the devices.

Prior to the release etch, it may in some cases be desirable to deposit a 1 µm protective layer of gold. This is useful, for example, to protect an exposed −z face of the LN during the release. More specifically, different lithium niobate crystal faces exhibit different etch rates. Whereas the +z, y, and x crystal faces etch much more slowly than the ion-damaged LN, the etch rate of the −z face is only four times lower than that of the ion-damaged LN. Hence unintended etching on an exposed −z face could make it difficult to control the final dimensions of the resonator. The gold protective layer, if used, can be removed after the final anneal by stripping in a mixture of potassium iodide and iodine.

I claim:

1. An electro-acoustic device having a range of operating frequencies including a frequency f corresponding to a guided acoustic wavelength λ, comprising:
   an input transducer configured to convert input electrical signals to traveling-wave acoustic signals;
   an output transducer configured to convert acoustic signals to electrical signals;
   a substrate; and
   a plurality of suspended, piezoelectric, acoustically waveguiding membranes supported in a common plane by the substrate, wherein:
   the input transducer is coupled to one of the waveguiding membranes;
   the output transducer is coupled to one of the waveguiding membranes; and
   the plurality of waveguiding membranes comprises at least a first and a second waveguiding membrane that have respective equally long straight sections that are parallel to each other, longer than the wavelength λ, and mutually separated by an air gap having a width less than the wavelength λ.

2. The electro-acoustic device of claim 1, wherein the waveguiding membranes are composed of lithium niobate.

3. The electro-acoustic device of claim 1, wherein the waveguiding membranes are composed of Z-cut lithium niobate.

4. The electro-acoustic device of claim 1, wherein the height and the width of the waveguiding membranes are selected such that a quasi-SH mode is guided at the frequency f.

5. The electro-acoustic device of claim 1, wherein the height and the width of the waveguiding membranes are selected such that a fundamental quasi-SH mode is guided at the frequency f.

6. The electro-acoustic device of claim 1, wherein the input transducer is coupled so as to inject acoustic waves into the first waveguiding membrane and the output transducer is coupled so as to receive acoustic waves from the second waveguiding membrane.

7. The electro-acoustic device of claim 1, wherein the input and output transducers are coupled to respective ends of the first waveguiding membrane and the second waveguiding membrane is conformed in a closed curve as a ring resonator.

8. The electro-acoustic device of claim 1, wherein:
the first waveguiding membrane is conformed in a closed curve as a ring resonator and has two equally long and parallel straight sections on opposing sides of the closed curve;
the plurality of waveguiding membranes further comprises a third waveguiding membrane having a straight section equal in length and parallel to the straight sections of the first and second waveguiding membranes;
the second and third waveguiding membranes are positioned on opposing sides of the first waveguiding membrane such that each of them is separated by an air gap from a respective one of the two straight sections of the first waveguiding membrane, each said air gap having a width less than the wavelength λ;
at least one input transducer is coupled to the second waveguiding membrane; and
at least one output transducer is coupled to the third waveguiding membrane.

9. The electro-acoustic device of claim 1 conformed as a displacement sensor, wherein:
the substrate comprises a reference platform and a variable platform that is displaceable relative to the reference platform;
the first waveguiding membrane is attached to the reference platform; and
the second waveguiding membrane is attached to the variable platform such that relative displacement of the variable platform varies the width of the air gap.

10. The electro-acoustic device of claim 1 conformed as an inertial sensor, wherein:
the substrate comprises a reference platform and a variable platform that is displaceable relative to the reference platform;
the first waveguiding membrane is attached to the reference platform;
the second waveguiding membrane is attached to the variable platform such that relative displacement of the variable platform varies the width of the air gap; and
an inertial proof mass is attached to the variable platform.

11. The electro-acoustic device of claim 1, wherein within the range of operating frequencies, each input and output transducer has an electrical impedance of 50Ω.

12. The electro-acoustic device of claim 1, wherein the equally long straight sections that are parallel to each other and separated by air gaps have a length in the range 0.1 to 10 millimeters.

13. The electro-acoustic device of claim 1, wherein each of the waveguiding membranes has a thickness that is smaller than the wavelength λ.

14. The electro-acoustic device of claim 1, wherein each of the waveguiding membranes has a thickness and a width that are smaller than the wavelength λ.

\* \* \* \* \*